United States Patent [19]
Chen

[11] Patent Number: 5,844,431
[45] Date of Patent: Dec. 1, 1998

[54] LOW NOISE LOW POWER CMOS CORRELATED DOUBLE SAMPLER

[75] Inventor: Xiaole Chen, Milpitas, Calif.

[73] Assignee: Exar Corporation, Fremont, Calif.

[21] Appl. No.: 715,201

[22] Filed: Sep. 18, 1996

[51] Int. Cl.[6] .................................................. G11C 27/02
[52] U.S. Cl. ................................................. 327/94; 327/96
[58] Field of Search .................................. 341/122–125; 330/9; 327/91, 93, 94, 96, 337, 554, 307, 309, 362, 379

[56] References Cited

U.S. PATENT DOCUMENTS

| | | | |
|---|---|---|---|
| 4,633,223 | 12/1986 | Senderowicz | 340/347 CC |
| 5,329,312 | 7/1994 | Boisvert et al. | 348/256 |
| 5,391,999 | 2/1995 | Early et al. | 327/554 |
| 5,392,043 | 2/1995 | Ribner | 341/143 |
| 5,410,270 | 4/1995 | Rybicki et al. | 330/9 |
| 5,514,999 | 5/1996 | Koifman et al. | 330/0 |

OTHER PUBLICATIONS

"A CMOS Front–End For CCD Cameras," C. Mangelsdorf et al., ISSCC Digest of Technical Papers, pp. 186–187 (1966).

*Primary Examiner*—My-Trang Nu Ton
*Attorney, Agent, or Firm*—Townsend and Townsend and Crew LLP

[57] ABSTRACT

An improved CMOS CDS circuit which can operate on 2.7 volts, provides increased noise immunity and can handle a 0.8 volts maximum signal input. The present invention provides internal capacitors to isolate the input pads. The present invention also provides switches and capacitors to perform a sample and hold function on every pixel value.

9 Claims, 2 Drawing Sheets

LOW NOISE LOW POWER CMOS CORRELATED DOUBLE SAMPLER

BACKGROUND OF THE INVENTION

The present invention relates to correlated double sampler (CDS) circuits, and in particular to such samplers in CMOS technology. This patent application presents a new circuit implementation of a low noise, low power correlated double sampler (CDS) in CMOS technology.

One use for a correlated double sampler is in processing digital image signals, such as signals from a CCD (Charge Coupled Device) in a video camera. Basically, the CDS subtracts the data signal from a reference signal to remove any noise which is common (correlated) to both. Typically, a CDS circuit has been implemented with bipolar technology in the prior art. Subsequently, digital processing is used with CMOS circuitry.

One implementation of a CDS circuit using CMOS technology is described in C. Mangelsdorf, K. Nakamura, S. Ho, and T. Brooks, "A CMOS Front-End For CCD Cameras," *ISSCC Digest of Technical Papers*, pp. 186–87 (1966). Such a design allows the combining of the CDS functions with the analog-to-digital converter (ADC) on a single chip. This implementation describes a chip which operates on a 3 volt power supply, a reduction from the five volts typically required for bipolar technology. The maximum input signal magnitude is 0.6 volts.

It would be desirable to have a CDS circuit in CMOS which operates on lower power, provides greater noise immunity and is compatible with the maximum signal input of bipolar circuits, 0.8 volts.

SUMMARY OF THE INVENTION

The present invention provides an improved CMOS CDS circuit which can operate on 2.7 volts, provides increased noise immunity and can handle a 0.8 volts maximum signal input.

The present invention provides internal capacitors to isolate the input pads. This increases the turn on resistance of the on-chip switch to a value which can be realized using MOS transistors. This enables a video speed CCD circuit to reset the black level of every pixel at the input pad.

The present invention also provides switches and capacitors to perform a sample and hold function on every pixel value. The present invention thus provides an implementation which operates on a lower voltage, handles an increased input voltage, and improves the linearity by about 2 bits of a digital value.

For a further understanding of the nature and advantages of the present invention, reference should be made to the following description taken in conjunction with the accompanying drawings.

DETAILED DESCRIPTION OF THE PREFERRED EMBODIMENTS

Figure 1:
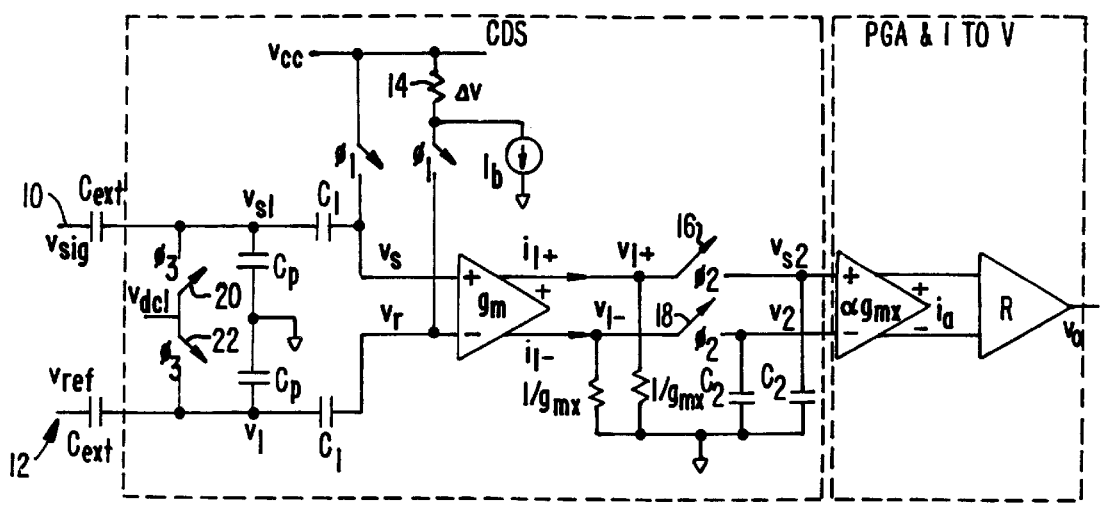
FIG. 1 is a simplified schematic of one embodiment of a CDS according to the present invention.

FIG. 1 shows a simplified linear model of a CCD analog front-end (AFE) which includes the CDS of this invention and the following programmable gain amplifier (PGA) block. An input signal is provided at a node 10, typically from a particular pixel in a CCD circuit. A reference voltage is provided to a reference node 12. Typically, the reference voltage signal on node 12 is provided from pixels at the edge of the CCD which are covered with metal to prevent any light penetration. These voltages are provided through external capacitors, $C_{EXT}$. The CDS function is performed by clamping the dark level of each pixel signal to a fixed voltage. Before each data level is transmitted, the clamping switch is opened to extract each pixel signal.

The capacitors $C_{EXT}$ (between 1 nF to 0.1 uF) shown in FIG. 1 are external ac coupling capacitors used to isolate the input pad from the output nodes, which has a large DC voltage, of the CCD chip. The large external capacitors are needed here to minimize the ac signal loss caused by the parasitic pad capacitors ($C_p$). For a video speed CCD AFE circuit, it is not feasible to reset the black level of every pixel at the input pad because the required RC time constant is only about 1.5 nanoseconds and the required turn on resistance of the on-chip switch is less than 1.5 Ω. In the CDS circuit of this invention, two small internal capacitors $C_1$ (about 10 pF) are added to isolate the input pad from the black level clamping nodes $v_a$ and $v_r$. The turn on resistance of the on-chip switch is now increased to 150 Ω which can be realized by MOS transistors. During the black level input period, the nodes $v_a$ and $v_r$ are clamped to power supply $v_c$ and voltage $v_c-\Delta v$ by $\phi_1$ controlled switches. The DC offset voltage, which is generated by injecting a DC current through a resistor 14, and designed at about 50% of the input signal swing, is required to increase the linear region of the transconductor because the input pixel signal is single-ended and always going down. The DC offset is programmed to track the gain. Before each pixel data being transmitted, the clamping switches are opened to float the $v_a$ and $v_r$ nodes so that the ac signal can be passed to the following transconductor $g_m$.

The transconductor $g_m$ converts the differential voltage $v_a-v_r$ into differential current $i_{1+}-i_{1-}=g_m(v_a-v_s)$. The dB linear programmable gain function applied to the differential output current is realized by a programmable differential transconductor $\alpha g_{mx}$. A clock $\phi_2$ controlled switch and a capacitor inserted between the transconductors $g_{mx}$ and $\alpha g_{mx}$ are used to perform sample and hold functions on every pixel value.

The transconductance circuit, by producing improved gain, provides greater noise rejection. In addition, the particular implementation of the transconductance circuit and associated circuitry, as described in more detail below, allows a voltage supply, $V_C$, of 2.7 volts to operate the invention. Such a lower voltage corresponds to lower power requirements by the circuit, which is important in battery operated environments, such as a hand-held, battery-operated video camera.

Figure 2:
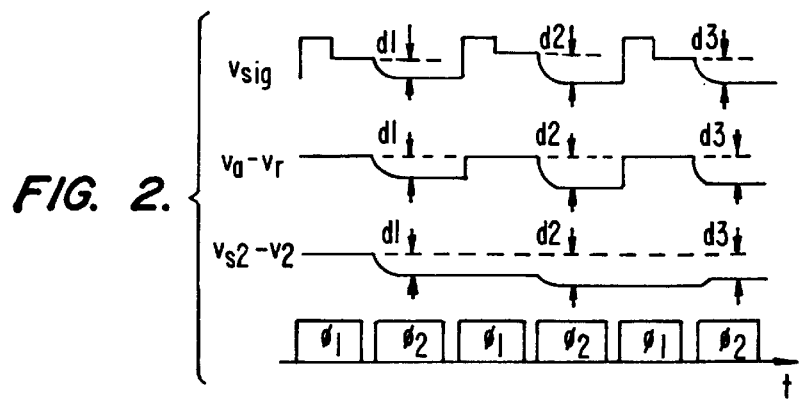
FIG. 2 is a timing diagram illustrating different signals in the circuit of FIG. 1.

FIG. 2 shows the input signal $v_{sig}$, the differential voltage $v_a-v_r$, which represent the extracted pixel signal, the sample/hold input pixel signal $v_{s2}-v_2$, and the control clocks $\phi_1$ and $\phi_2$. The switches are closed when the control clock is high.

Clock signal $\phi_2$ is the sample and hold clock signal controlling the switches 16 and 18 of FIG. 1. Clock signal $\phi_1$ resets the dark level in between every $\phi_2$ clock signal. Not shown is the $\phi_3$ clock signal controlling switches 20 and 22, which will be asserted after each line of a CCD display.

It should be noted that the actual signals utilized are currents, and the differential voltage $V_{S2}$ minus $V_2$ shown on FIG. 2 is a distorted signal. The actual output differential current of the CDS, $I_0 \pm I_0-$, will be cleaner.

The inventor has found that the implementation of the circuits provides an output signal which has linearity which is accurate to 9 bits when the signal is subsequently converted into digital form. In addition, the voltage gain between nodes $V_A$ and $V_{S2}$ can be implemented so that the noise performance of the system is improved. The present invention also allows a single 2.7 volt power supply to be utilized, rather than a higher voltage. The circuit can handle a maximum of 0.8 volt input voltage swing in a standard CMOS process.

Figure 3:
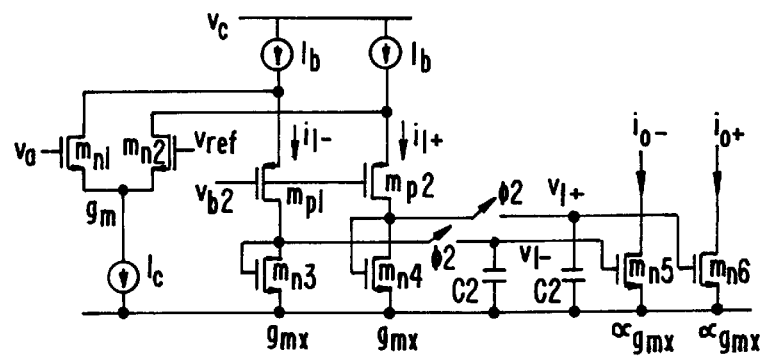
FIG. 3 is a schematic diagram of one embodiment of the transconductors of FIG. 1.

The advantages of the CDS circuit can be better understood by looking at the actual transistor implementation of the transconductors shown in FIG. 3. The first transconductor $g_m$ is implemented by an NMOS differential pair. The ac output current $i_{1+}$ and $i_{1-}$ of $g_m$ are folded by PMOS transistors $m_{p1}$ and $m_{p2}$, and injected into diode connected transistors $m_{n3}$ and $m_{n4}$ used to implement the transconductors $g_{mx}$. The ac output current $i_{o+}$ and $i_{o-}$ (from transistors $m_{n5}$ and $m_{n6}$ used to implement the transconductor $\alpha g_{mx}$) are proportional to $i_{1+}$ and $i_{1-}$ since $m_{n3}$ and $m_{n5}$ ($m_{n4}$ and $m_{n6}$) realize a current mirror with a scale factor of $\alpha$. The fully differential transconductor $\alpha g_{mx}$ shown in FIG. 1 is actually implemented by two single-ended transconductors $\alpha g_{mx}$. The transconductors $g_m$ and $\alpha g_{mx}$ are not linear transconductors and their transconductance changes as the signal current changes.

The required minimum power supply of the CDS circuit is determined by the following expression.

$$v_c \geq v_{gsn1} + v_{sig} + v_{dsatc}$$

where $v_{gsn1}$ is the gate to source voltage of the transistor $m_{n1}$, $v_{sig}$ (about 0.8 V in this design) is the maximum input signal magnitude, and $v_{dsatc}$ (about 0.3 V) is the minimum drain to source voltage required by the transistor used to implement the current source $I_c$. Under a 2.7 V power supply, $v_{gsn1}$ can be as large as 1.6 V so that the circuit can be integrated in a digital CMOS process.

Figure 4:
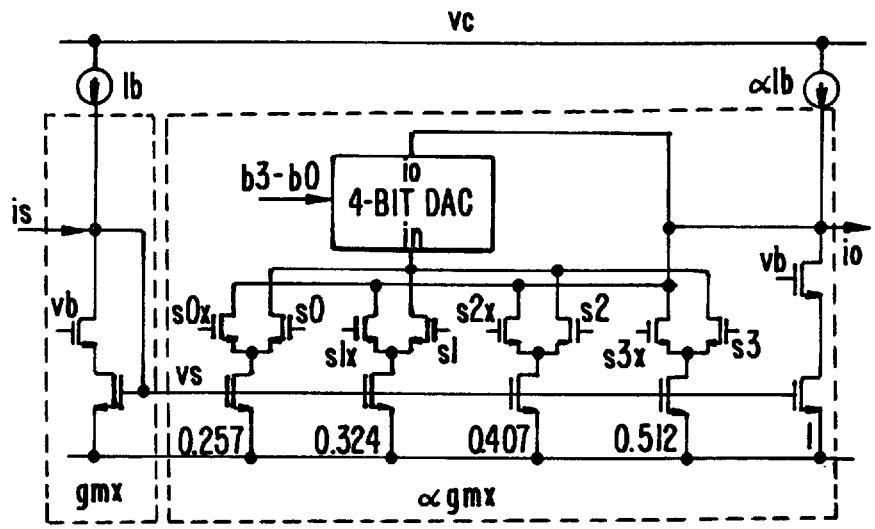
FIG. 4 is a schematic diagram of a PGA current gain circuit.

The transconductor $\alpha g_{mx}$ is used to realize programmable gain and its implementation is depicted in FIG. 4 which was disclosed in my previous patent application (Piece-Wise Linear Approximation of a dB Linear Programmable Gain Amplifier, filed Apr. 16, 1996, Ser. No. 08/631,900). The sample and hold operation on the data level of each pixel is performed on the gate voltage $v_S$, which is a distorted signal, of the mirror transistors. If the switch is ideal, there will be no distortion introduced. However, a real MOS switch will introduce an offset voltage ($\Delta v$) due to the charge injection and clock feedthrough. Fortunately, following simple calculation shows that the signal distortion introduced by the offset voltage of the switch is greatly reduced by the fully differential design.

Assuming a single-ended current mirror shown in FIG. 4 will have a gate voltage difference $\Delta v$ between the transconductors $g_{mx}$ and $\alpha g_{mx}$, the input and output ac currents ($i_s$ and $i_o$) are described by the following equations:

$$i_s = \beta(v_s + v_{dsat0})^2 = \beta v^2_{dsat0} = \beta(v^2_s + v_s v_{dsat0})$$

$$i_o = \alpha i_s + \alpha\beta(2\Delta v(v_s + v_{dsat0}) + \Delta v^2)$$

By using the expression of the DC bias current $I_0 = \beta v^2_{dsat0}$ and Taylor's expansion, we can approximate the ac output current of a single-ended current mirror by the following equation.

$$i_o = \alpha i_s + \alpha \left[ \frac{2\Delta v}{v_{dsat0}} + \left(\frac{\Delta v}{v_{dsat0}}\right)^2 \right] I_O + \quad (4)$$

$$\alpha \frac{\Delta v}{v_{dsat0}} \left[ 1 - \frac{1}{4} \frac{i_s}{I_O} + \frac{1}{8}\left(\frac{i_s}{I_O}\right)^2 + \ldots \right] i_s$$

The offset voltage generated by the sample/hold switch and capacitor generates two error terms. The second term of the above expression is a DC component. The third term, which consists of the original current signal and its higher order harmonics, is signal dependent. Therefore, the ac output current of a single-ended current mirror is distorted.

The signal distortion problem can be greatly reduced by using a fully differential approach. Assume the input signal current is fully differential. Then $i_{1+}$ and $i_{1-}$ can be expressed by the differential ac input current $i_{in} = i_{1+} - i_{1-}$ as below.

$$i_{1+} = \frac{i_{in}}{2}, \text{ and } i_{1-} = -\frac{i_{in}}{2}$$

By taking the differential output current $i_{out} = i_{o+} - i_{o-}$, the DC component and the even order harmonics shown in equation (4) are canceled. The differential ac output current can be approximated (up to the third order term) by the following expression.

$$i_{out} \approx \alpha i_{in} + \alpha \frac{\Delta v}{v_{dsat0}} i_{in} + \alpha \frac{1}{32} \frac{\Delta v}{v_{dsat0}} \left(\frac{i_{in}}{I_o}\right)^2 i_{in} \quad (5)$$

The second term of the above expression is a gain error term, while the third term introduces a third order harmonic which can be reduced by biasing the current mirror transistors at a larger current ($I_0$) and $v_{dsat0}$ value. The maximum signal current should be small compared to the bias current. Assuming $v_{dsat0} = 300$ mV, $\Delta v = 30$ mV, and $i_{inmax} = 0.3 I_0$, the calculated maximum third order harmonic from the expression is only about 0.03%.

Figure 5:
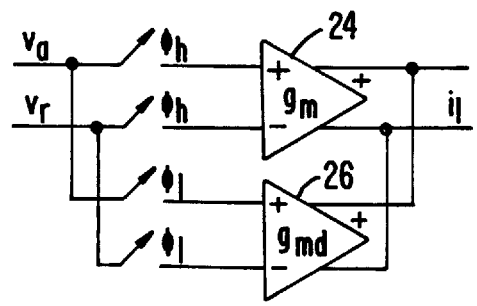
FIG. 5 is a schematic diagram of one embodiment of alternate high and low gain transconductors for the circuit of FIG. 1.

Another advantage of this CDS circuit is that a voltage gain between the differential input $v_a - v_r$ and the differential sample/hold voltage node $v_{1+} - v_{1-}$ can be implemented so that the noise performance of the system is improved. The voltage gain, which is $g_m/g_{mx}$, can be adjusted by changing the transconductance of the transconductor $g_m$. FIG. 5 shows the implementation of an alternate high and low gain transconductor $g_m$. In a low gain setting, there is no gain implemented between $v_a - v_r$ and $v_{1+} - v_{1-}$. The degenerated transconductor 24, which can handle large input signals and has smaller transconductance, is turned on ($\phi_h$ high to close the switches). In a high gain setting, the input signal is small so that the simple differential pair transconductor 26, which provides large transconductance, can be selected ($\phi_1$ high to close the switches) without introducing large linearity errors. The CDS can now provide some gain to improve the noise performance of the system because the equivalent input noise power introduced by the circuitry after $v_{1+} - v_{1-}$ is divided by the square of the gain.

As will be understood by those with skill in the art, the present invention may be embodied in other specific forms without departing from the spirit or essential characteristics thereof. For example, other specific circuit implementations of the transconductors could be used. Accordingly, the foregoing disclosure is intended to be illustrative, but not limiting, of the scope of the invention which is set forth in the following claims.

What is claimed is:

1. A CMOS correlated double sampler circuit, comprising:

a signal input node;

a reference input node;

a first transconductor, having inputs coupled to said signal input node and said reference input node, configured to produce a differential current output from voltages on said nodes;

a first internal capacitor coupled between said signal input node and a first input of said first transconductor;

a second internal capacitor coupled between said reference input node and a second input of said first transconductor;

a second transconductor, coupled to a first output of said first transconductor, configured to convert a current into a voltage;

a third transconductor, coupled to a second output of said first transconductor, configured to convert a current into a voltage;

a first sampling switch coupled to the first output of said first transconductor;

a first sampling capacitor coupled to said first sampling switch;

second sampling switch coupled to the second output of said first transconductor; and a second sampling capacitor coupled to said second sampling switch.

2. The circuit of claim 1 further comprising:

a DC offset circuit, coupled to one of said nodes, configured to provide a DC offset which increases the linear range of said first transconductor.

3. The circuit of claim 2 wherein said DC offset circuit comprises:

a voltage supply coupled to said signal input node through said first internal capacitor;

a current source;

a resistor coupled between said voltage supply and said current source; and a switching circuit selectively coupling said voltage supply to said signal input node and selectively coupling said resistor to said reference input node.

4. The circuit of claim 1 wherein said first transconductor comprises a differential pair of MOS transistors.

5. The circuit of claim 1 wherein said first transconductor comprises a low gain transconductor and a high gain transconductor, and further comprising:

a switching circuit configured to connect said nodes to said low gain transconductor in response to a low gain signal, and to connect said nodes to said high gain transconductor in response to a high gain signal.

6. The circuit of claim 5 further comprising a programmable gain amplifier coupled to said first transconductor and configured to produce variable gain signals.

7. The circuit of claim 5 wherein said low gain transconductor comprises a degenerated transconductor.

8. The circuit of claim 5 wherein said high gain amplifier comprises a differential pair transconductor.

9. A CMOS correlated double sampler circuit, comprising:

a signal input node;

a reference input node;

a first transconductor, having inputs coupled to said signal input node and said reference input node, configured to produce a differential current output from voltages on said nodes, said first transconductor including a high gain transconductor and a low gain transconductor;

a first internal capacitor coupled between said signal input node and a first input of said first transconductor;

a second internal capacitor coupled between said reference input node and a second input of said first transconductor;

a switching circuit configured to connect said nodes to said low gain transconductor in response to a low gain signal, and to connect said nodes to said high gain transconductor in response to a high gain signal;

a second transconductor, coupled to a first output of said first transconductor, configured to convert a current into a voltage;

a third transconductor, coupled to a second output of said first transconductor, configured to convert a current into a voltage, said second and third transconductors comprising third and fourth MOS transistors;

a first sampling switch coupled to said second transconductor;

a first sampling capacitor coupled to said first sampling switch;

a second sampling switch coupled to said third transconductor;

a second sampling capacitor coupled to said second sampling switch;

a fourth transconductor having first and second inputs coupled to said first and second sampling switches, and configured to provide a differential current output signal, said fourth transconductor comprising first and second MOS transistors;

said first and third MOS transistors being connected as a first current mirror; and said second and fourth MOS transistors being connected as a second current mirror.

* * * * *